United States Patent
Suzuki et al.

(10) Patent No.: US 9,122,000 B2
(45) Date of Patent: Sep. 1, 2015

(54) ILLUMINATOR USING A COMBINATION OF PSEUDO-WHITE LED AND LENS SHEET

(75) Inventors: Shingo Suzuki, Kitasaku-gun (JP); Masaki Asai, Kitasaku-gun (JP)

(73) Assignee: MINEBEA CO., LTD., Nagano (JP)

( * ) Notice: Subject to any disclaimer, the term of this patent is extended or adjusted under 35 U.S.C. 154(b) by 143 days.

(21) Appl. No.: 13/594,322

(22) Filed: Aug. 24, 2012

(65) Prior Publication Data

US 2013/0051029 A1 Feb. 28, 2013

Related U.S. Application Data

(63) Continuation-in-part of application No. 13/216,499, filed on Aug. 24, 2011, now Pat. No. 8,529,077.

(51) Int. Cl.
| | |
|---|---|
| F21V 5/02 | (2006.01) |
| F21V 7/04 | (2006.01) |
| G02B 3/08 | (2006.01) |
| A01G 7/04 | (2006.01) |
| H01L 33/58 | (2010.01) |
| F21V 5/04 | (2006.01) |
| G02B 19/00 | (2006.01) |
| F21Y 101/02 | (2006.01) |
| H01L 33/50 | (2010.01) |

(52) U.S. Cl.
CPC .................. *G02B 3/08* (2013.01); *A01G 7/045* (2013.01); *F21V 5/045* (2013.01); *G02B 19/0028* (2013.01); *G02B 19/0061* (2013.01); *H01L 33/58* (2013.01); *F21Y 2101/02* (2013.01); *H01L 33/50* (2013.01)

(58) Field of Classification Search
CPC ..... F21V 5/045; F21V 2101/02; A01G 7/045; G02B 3/08; G02B 19/0028; G02B 19/0061; H01L 33/58; H01L 33/60
USPC .............. 362/84, 297, 311.01, 612, 614, 620, 362/622, 626, 333, 339
See application file for complete search history.

(56) References Cited

U.S. PATENT DOCUMENTS

| | | | | |
|---|---|---|---|---|
| 4,823,246 A * | 4/1989 | Dilouya | | 362/328 |
| 6,921,182 B2 * | 7/2005 | Anderson et al. | | 362/231 |
| 7,061,677 B2 * | 6/2006 | Lee | | 359/457 |
| 7,470,047 B2 * | 12/2008 | Lin et al. | | 362/339 |
| 7,484,871 B2 * | 2/2009 | Boxler | | 362/545 |
| 7,520,642 B2 * | 4/2009 | Holman et al. | | 362/328 |
| 7,575,344 B2 * | 8/2009 | Lin et al. | | 362/339 |
| 7,686,481 B1 * | 3/2010 | Condon et al. | | 362/331 |
| 7,701,648 B2 * | 4/2010 | Amano et al. | | 359/742 |
| 7,883,226 B2 * | 2/2011 | Li | | 362/84 |
| 7,909,485 B2 * | 3/2011 | Chuang | | 362/330 |
| 8,376,601 B2 * | 2/2013 | Yashiro | | 362/606 |
| 8,523,385 B2 * | 9/2013 | Lu et al. | | 362/231 |
| 8,568,009 B2 * | 10/2013 | Chiang et al. | | 362/563 |

(Continued)

FOREIGN PATENT DOCUMENTS

| | | |
|---|---|---|
| JP | A-2002-221605 | 8/2002 |
| JP | A-2011-113755 | 6/2011 |

*Primary Examiner* — John A Ward
(74) *Attorney, Agent, or Firm* — Oliff PLC

(57) ABSTRACT

There is provided an illuminator comprising: a light source; and a lens sheet that is arranged on the optical axis of the light source and that has a plurality of prisms, wherein the light source is composed of: a luminous element; and phosphors that irradiate with lights emitted from the luminous element, and the lens sheet includes prisms that have focal distances each different from the prisms adjacent thereto.

14 Claims, 8 Drawing Sheets

(56) References Cited

U.S. PATENT DOCUMENTS

| | | | |
|---|---|---|---|
| 8,727,580 B2* | 5/2014 | Takayama et al. | 362/333 |
| 8,848,129 B2* | 9/2014 | Lin et al. | 349/58 |
| 8,894,250 B2* | 11/2014 | Asai et al. | 362/309 |
| 2003/0058532 A1* | 3/2003 | Suzuki et al. | 359/455 |
| 2006/0104092 A1* | 5/2006 | Feng et al. | 362/626 |
| 2007/0030688 A1* | 2/2007 | Amano et al. | 362/521 |
| 2011/0249452 A1* | 10/2011 | Chen et al. | 362/339 |
| 2011/0280044 A1* | 11/2011 | Niioka et al. | 362/607 |
| 2013/0242568 A1* | 9/2013 | Asai | 362/311.06 |

* cited by examiner

F I G. 1
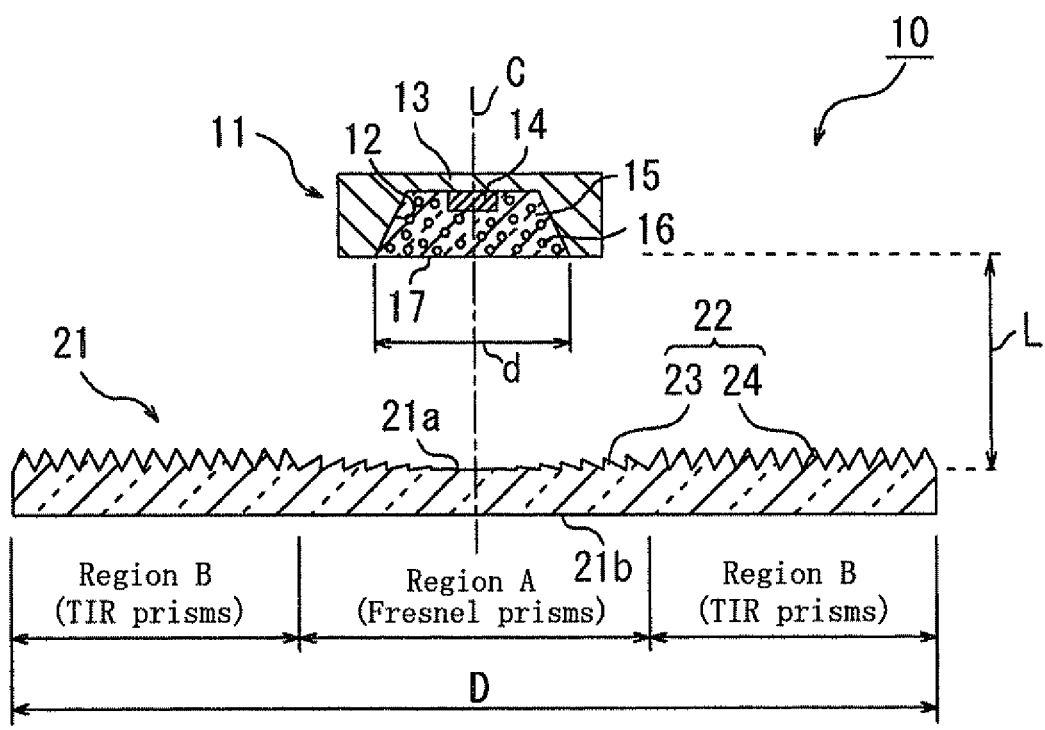

F I G. 2
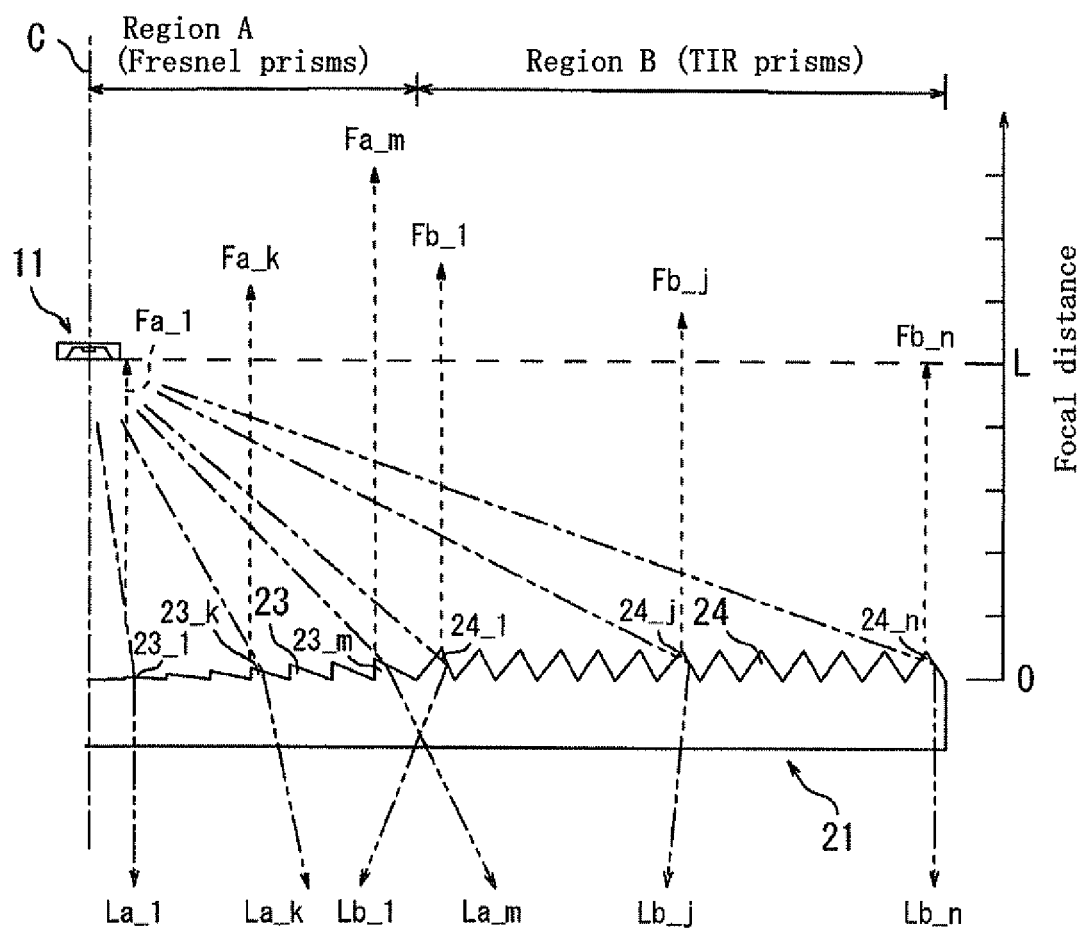

F I G. 4 A
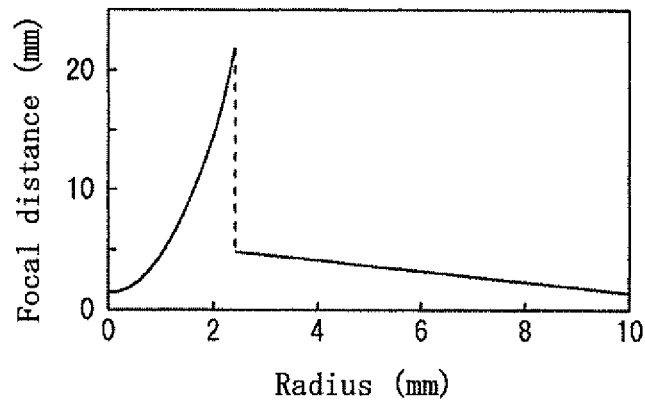
F I G. 4 B
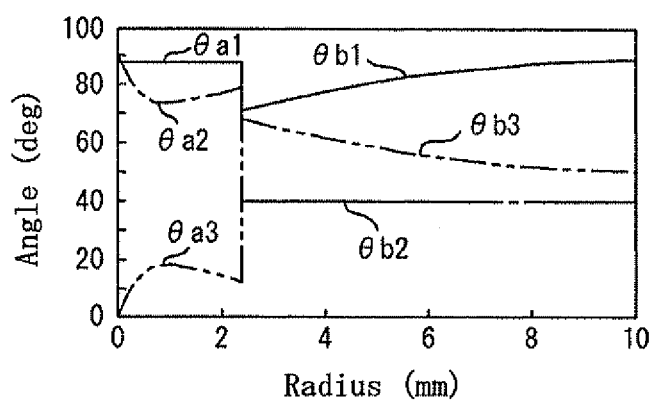
F I G. 4 C
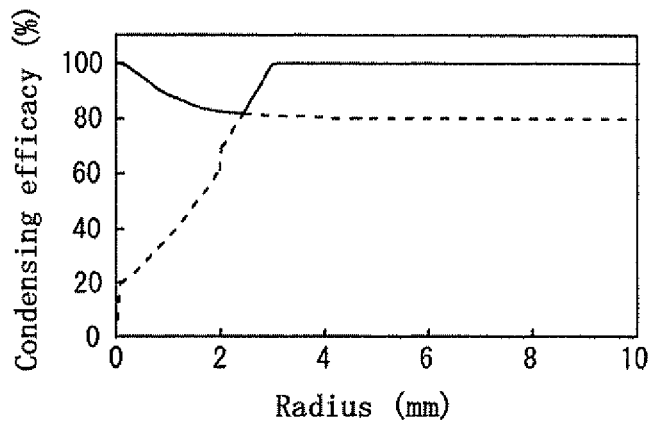

F I G. 5 A
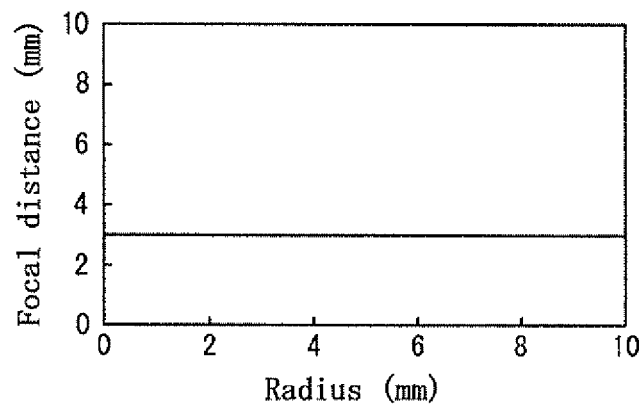
F I G. 5 B
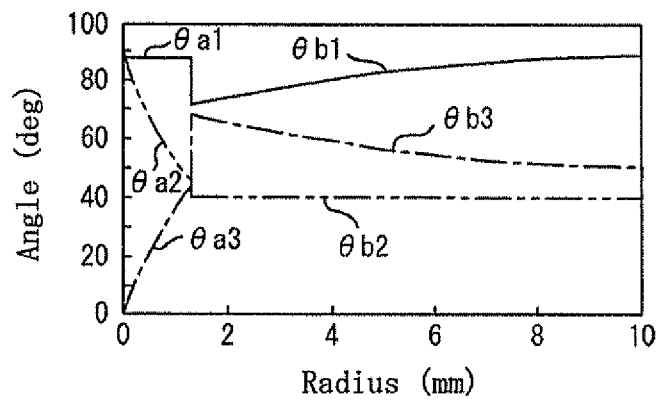
F I G. 5 C
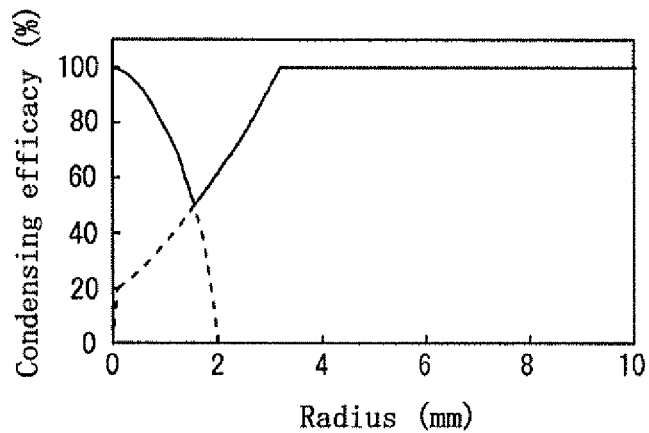

F I G. 8
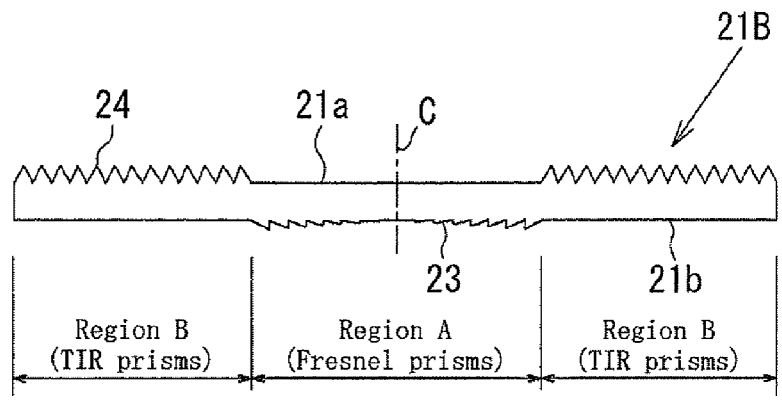
F I G. 9
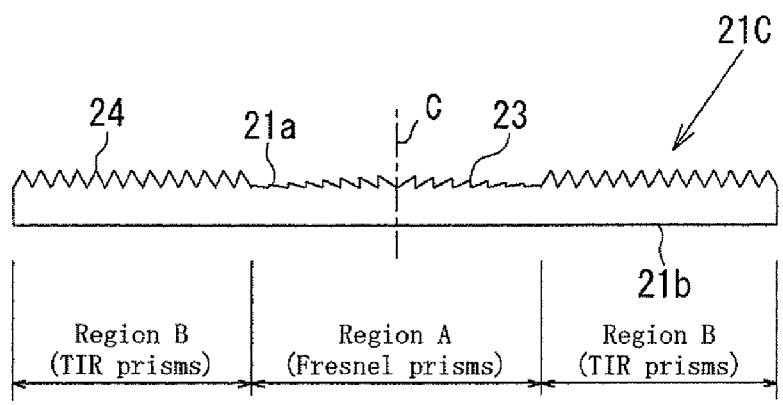
F I G. 10
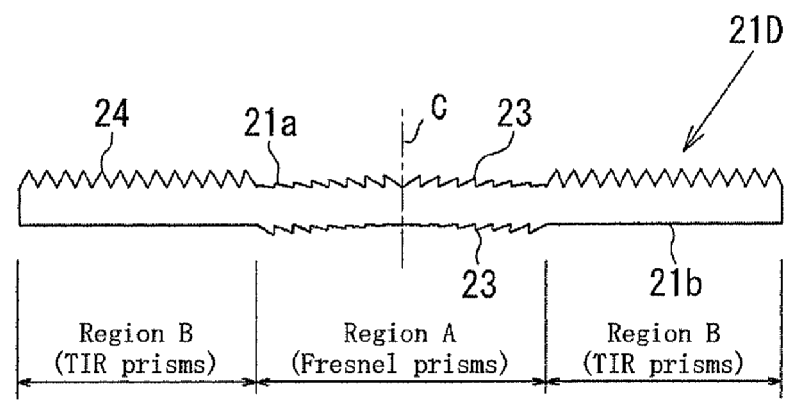

ILLUMINATOR USING A COMBINATION OF PSEUDO-WHITE LED AND LENS SHEET

This is a Continuation-in-Part of U.S. application Ser. No. 13/216,499 filed Aug. 24, 2011. The disclosure of the prior application is hereby incorporated by reference herein in its entirety.

BACKGROUND OF THE INVENTION

1. Field of the Invention

The present invention relates to an illuminator that is composed in combination of: a white light source and a sheet condensing lens.

2. Description of the Related Art

In a conventional illuminator that has been generally known, a sheet condensing lens such as a Fresnel lens (hereinafter referred to as the "lens sheet") is arranged in front of (or on the optical axis of) a light source, so that the orientation of outgoing lights is controlled contributing to a high illumination (or a high brightness). See, for example, Japanese Patent Application Laid-open No. 2002-221605 (hereinafter referred to as the "Patent Document").

Considering an illuminator disclosed in the Patent Document, as shown in FIG. 11, it is composed as that a lens sheet (a Fresnel lens) 72 is arranged in front of a linear light source 71 (or, at the upper portion of the FIG. 8). The lens sheet 72 has a plurality of refraction prisms (a Fresnel lens) at a center region thereof which is the side of an optical axis 73, the refraction prisms having refraction effects. On the other hand, at or near the outer circumference of the lens sheet 72, a plurality of reflection prisms (referred to as a TIR lens or a Total Internal Reflection lens) having reflection effects is formed.

As discussed hereinabove, since the lens sheet 72 has the refraction prisms at the center region thereof and the reflection prisms at the outer circumference region thereof, compared to the lens sheet where either the refraction prisms or the reflection prisms are individually used, it is possible to obtain luminous lights of high efficiencies due to high illuminations by having large intensified outgoing lights. Also, the intensity of the luminous lights is well homogenized. This is why outgoing lights that have been refracted by the refraction prisms tend to have a large intensity at the center of the lens sheet, but the intensity tends to decrease at the outer circumference of the lens sheet. On the contrary, the outgoing lights that have been reflected by the reflection prisms tend to have a small intensity at the center of the lens sheet, but the intensity tends to increase at the outer circumference of the lens sheet.

In recent years, there are notable demands on illuminators such as a downlight or a spotlight, which use a compact LED (Light Emitting Diode) with excellent environment compatibilities. Considering LEDs which supply white lights, a so-called pseudo-white LED has been widely used. This pseudo-white LED is composed of the following parts in combination: an LED chip (luminous element) that emits a blue-series light (the center wavelength of 410 nm to 480 nm); and a yellow phosphor that absorbs the blue-series light and converts the blue-series light into a yellow-series light (the wavelength range of 480 nm to 700 nm).

Here, the present inventors have constructed an illuminator by combining a pseudo-white LED of a surface mounting type and a lens sheet for a point light source (LED) disclosed by the Patent Document (see the section [0046]). With this illuminator the inventors could obtain luminous lights with a high illumination; however, the inventors observed color shadings in the luminous lights resulting in poor visibility. More specifically, the lights that have been passed through the lens sheet are recognizable as a white light as a whole; however, the lights become somewhat bluish at the center region of the lens sheet while the lights become somewhat yellowish at the outer circumference region of the lens sheet.

The cause of the color shadings will be explained as follows. As shown in FIG. 12, blue lights will be emitted from an LED chip 83 that is mounted on an electrode terminal 82 and that is placed on the bottom surface of the concave portion of a lamp house 81. Among the emitted blue lights, there are a light L1 travelling approximately parallel relative to an optical axis and a light L2 travelling in inclination relative to the optical axis. These lights L1 and light L2 have different optical path lengths, the optical path length being defined by light passing through a sealing body 85 including a plurality of yellow phosphors 84 therewith. To be more specific, the light L1 has a shorter optical path length than the light L2 (meaning that the light L1 has a shorter distance than the light L2 when passing through in the sealing body 85) whereby the light L1 has a relatively small ratio of being converted into a yellow light. The light L1 is thus a bluish white light. On the other hand, the light L2 has a longer optical path length than the light L1 (meaning that the light L2 has a longer distance than the light L1 when passing through in the sealing body 85) whereby the light L2 has a relatively large ratio of being converted into a yellow light. The light L2 is thus a yellowish white light.

SUMMARY OF THE INVENTION

The present invention has been made in light of the above-described circumstances, and it is an object of the present invention to provide an illuminator that has a high illumination and a high brightness and that can well reduce color shadings.

In order to achieve the object described above, according to a first aspect of the present invention, there is provided an illuminator comprising: a light source; and a lens sheet that is arranged on an optical axis of the light source and that has a plurality of prisms, wherein the light source is composed of: a luminous element; and phosphors that irradiate with lights emitted from the luminous element, and the lens sheet includes prisms that have focal distances each different from the prisms adjacent thereto.

Considering the above embodiment in the present invention, the lens sheet that is arranged on the optical axis of (or in front of) the light source is configured to have the prisms at least on any of the surfaces (either the facing surface or the exit surface) of the lens sheet, each of the prisms adjacent thereto having different focal distances to each other. Here, light that is introduced into each of the prisms is guided in a forward direction with some inclinations relative to the optical axis at an angle according to the focal distance of each prism (and the distance between the light source and the lens sheet). Accordingly, each light introduced into each prism with a different focal distance will advance in such a manner as to cross (or mix) with each other. For example, when light influenced by color shadings that has been emitted from the pseudo-white light source which is composed of the luminous element emitting lights with a predetermined wavelength and the phosphors irradiating fluorescence with lights emitted from the luminous element is introduced into the lens sheet, the light will be subjected to color mixture (or balancing) according to the size of the focal distance of each prism contributing to acquisition of luminous lights that have reduced color shadings.

In the first aspect of the present invention, the lens sheet may include an area where at least a part of the prisms among the plurality of the prisms are configured to have a focal distance that is changed according to a distance from the optical axis.

Considering the above embodiment in the present invention, the focal distance of the plurality of prisms that is placed in a specific region is adapted to change according to distance from the optical axis whereby it becomes possible to not only dramatically reduce the color shadings but also to facilitate design and manufacture of the lens sheet.

In the first aspect of the present invention, the plurality of prisms may include a plurality of refraction prisms with certain refraction functions. The plurality of refraction prisms may be configured to have a focal distance which becomes larger as moving away from the optical axis.

In the first aspect of the present invention, the plurality of refraction prisms may be formed on a surface facing the light source. When this configuration is applied, it becomes possible to achieve further effective color shading reduction. Based on a reason to be described hereinbelow, this configuration also allows obtaining of further effective illumination light.

In the first aspect of the present invention, the plurality of prisms may include a plurality of reflection prisms with certain reflective functions, the plurality of reflection prisms being configured to have a focal distance which becomes larger as moving closer to the optical axis.

In the first aspect of the present invention, the lens sheet may include an area being configured as that at least a part of the prisms of the plurality of prisms have a focal distance which randomly changes irrespective of a distance from the optical axis (in a direction moving away from the optical axis).

In the first aspect of the present invention, the area where the focal distance randomly changes may be positioned at the outer periphery of the lens sheet. With this configuration, it is possible to reduce the color shadings further effectively.

In the first aspect of the present invention, the plurality of prisms may be arranged in a rotational symmetry around the optical axis. With this configuration, it is possible to reduce the color shadings in all of the radiant directions around the optical axis.

In the first aspect of the present invention, the lens sheet may have a flat surface thereon, the flat surface being placed between each of the prisms that is adjacent to each other.

Considering the above embodiment in the present invention, it is expected to further reduce the color shadings and to facilitate the design and manufacture of the lens sheet.

In the first aspect of the present invention, it is preferable that the luminous element is a light-emitting diode that emits a blue-series light; and a phosphor is the one that receives the blue-series light and converts the blue-series light into a yellow-series light.

Considering the above embodiment in the present invention, it becomes possible to manufacture the illuminator having the above-explained advanced effects at a low cost.

BRIEF DESCRIPTION OF THE DRAWINGS

FIG. 1 is a sectional view that exemplifies the whole structure of an illuminator according to the embodiments of the present invention;

FIG. 2 is a right-half sectional view relative to an optical axis that explains the structure of a lens sheet and outgoing lights of the illuminator (hatching omitted);

FIG. 3A is a Fresnel prism, and FIG. 3B is a TIR prism;

FIGS. 4A to 4C are graphs that explain the specific structure and properties of the lens sheet where each of these FIGS. indicates the focal distance, angle and condensing efficacy of each prism;

FIGS. 5A to 5C are graphs that explain the structure of a conventional lens sheet in comparison with the above FIG. 4 where each of these FIGS. indicates the focal distance, angle and condensing efficacy of each prism;

FIG. 8 is a sectional view that shows another modified example of the lens sheet where a Fresnel lens is formed on an exit surface of the lens sheet;

FIG. 9 a sectional view that shows still another modified example of the lens sheet where a concave Fresnel lens is applied;

FIG. 10 is a sectional view that shows yet another modified example of the lens sheet where the Fresnel lens is formed both on a facing surface and the exit surface of the lens sheet;

DETAILED DESCRIPTION OF THE PREFERRED EMBODIMENTS

Figure 3A:
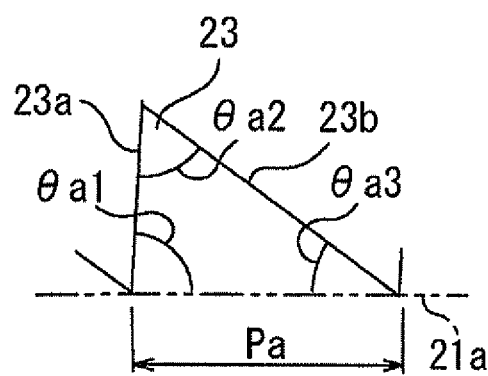
FIGS. 3A and 3B are sectional views that explain the contour of a prism on the lens sheet where

Preferred embodiments of an illuminator 10 according to the present invention will be described with reference to the accompanying drawings. Here, in each of the drawings, for making the present invention further understandable, some portions of the drawings may be typically expressed by exaggerating some structural elements. Accordingly, it may not accurately display actual dimensions, dimensional ratios or contours of the illuminator 10.

The illuminator 10 is, as shown in FIG. 1, composed of: an LED 11 as a light source that emit white lights in a forward direction (toward a bottom side in FIG. 1); a lens sheet 21 that is arranged facing the LED 11 (or on an optical axis C) and that controls the orientation of the white lights emitted from the LED 11; and a cup-shaped or a closed-end cylindrical reflective mirror (not shown) that covers the external marginal portion of both the LED 11 and the lens sheet 21 in whole.

The LED 11 is the pseudo-white LED that has been explained in the related art. In the present embodiment, the LED 11 is composed of: a white-resin made lamp house 13 that has a truncated cone concave portion 12 at its center; an LED chip (luminous element) 14 that is mounted at the bottom of the concave portion 12 and that emits blue lights (that is, lights with predetermined wavelengths); a sealing body 15 made of a transparent resin that is mounted on the concave portion 12 in such a manner as to cover the LED chip 14; and phosphors (for example, YAG phosphor) 16 that are dispersed in the sealing body 15 and that receives blue lights emitted by the LED chip 14 so as to radiate yellow lights (fluorescence).

The sealing body 15 in which the phosphors 16 are dispersed is formed to be a truncated cone that gradually opens from the LED chip 14 toward the lens sheet 21. Accordingly, as explained in the related art, among lights that are radially emitted from a luminous surface 17, which is the opening of the lamp house 13, lights emitted approximately parallel relative to an optical axis (center axis) C tend to be somewhat bluish white lights. On the other hand, lights that are emitted with inclination relative to the optical axis C tend to be somewhat yellowish white lights. In the example of FIG. 1, only one LED chip 14 is mounted within the lamp house 13; however, the present invention is not limited thereto. The LED chip 14 may be more than one (for example, some dozen LED chips). Further, these plural LED chips 14 may be each arranged to contour a circle as a whole. Here, each of the LED chips 14 has an own axis, and the pitch between two axes is approximately 0.25 mm. When the LED 11 includes the plurality of LED chips 14, it is possible to arrange the geometric center axis of the plurality of LED chips 14 to be the general optical axis C of the LED 11.

Next, as to the lens sheet 21, which is the main feature of the present invention, it is made of a transparent resin (in the present invention, acrylic resin with the refraction index of 1.49) and formed into a disk shape with the diameter of D (in the present invention, through an injection molding). The lens sheet 21 of the present embodiment is arranged so as to correspond its rotation center to the optical axis C, so that a distance between a surface facing the LED 11 (hereinafter referred to as the "facing surface 21a") and the luminous surface 17 of the LED 11 becomes a predetermined distance L (hereinafter referred to as the "LED-Sheet distance L").

In the embodiments of the present invention, the LED-Sheet distance L is made approximately correspondent to a diameter d of the luminous surface 17 of the LED 11; however, in order to fully enjoy later-explained functional effects of the present embodiments regardless of contours (small or thin), it would be preferable that the distance L between the LED and the lens sheet 21 is set to be 0.5 to 1.5 times as long as the diameter d. Further, as the same reason, it is preferable that a diameter D of the lens sheet 21 is set to $TAN^{-1}$ (D/2L) <80°. The present invention is however not limited to this configuration.

At the facing surface 21a of the lens sheet 21, a plurality of prisms 22 that is concentric around the optical axis C (a reference position) is provided. The plurality of prisms 22 is, as same with the related art, composed of: a plurality of (for convenience, m pieces of) refraction prisms (hereinafter referred to as the "Fresnel prisms") 23 that constitutes a Fresnel lens and that is formed at a region A at the side of the optical axis C; and a plurality of (as the same, n pieces of) reflection prisms (hereinafter referred to as the "TIR prisms") 24 that constitutes a TIR lens and that is formed at regions B that are radially outside the region A. With this structure, luminous lights with a high illuminance can be emitted from an exit surface 21b (the surface opposite to the facing surface 21a) of the lens sheet 21. Here, a boundary between the Fresnel prism 23 and the TIR prism 24 can be determined by selecting either the Fresnel prism 23 or the TIR prism 24 that has more effective lights in ratio.

The plurality of (m+n pieces of) prisms 22 is, as indicated by ordinate axes in HG 2, formed as that the focal distance F of the prisms 22 is continuously changed according to a distance from the optical axis C in each of the regions A and B. Here, the focal distance of the Fresnel prisms 23 is indicated by Fa, and the focal distance of the TIR prisms 24 is indicated by Fb. In the identical prisms 22, the focal distance F becomes constant regardless of a position in the circumferential position of the prisms 22.

Considering the focal distance Fa of the Fresnel prisms 23, in the present invention, the focal distance Fa_1 of a first Fresnel prism 23_1 that is placed in the most inside in a radial direction is made correspondent with the LED-Sheet distance L. The present invention is however not limited to this configuration. Here, a flat surface portion exists more inside the Fresnel prism 23_1. This flat surface may be considered as a first Fresnel prism. As to the plurality of Fresnel prisms 23 besides the first Fresnel prism 23_1, the focal distance Fa will be continuously larger as moving toward outside in a radial direction. This will be discussed with reference to FIG. 2. Starting from the most inside in a radial direction, the Fresnel prisms are designated as 23_1, 23_k, and 23_m (23_m will be the most outside in a radial direction). In this condition, each of the focal distances Fa_1, Fa_k, and Fa_m respectively corresponding to the Fresnel prisms 23_1, 23_k, and 23_m are determined in the following relation.

$$L=Fa\_1<Fa\_k<Fa\_m$$

By setting the focal distance Fa of each of the Fresnel prisms 23, light La_1 that passes through the Fresnel prism 23_1 placed the most inside in a radial direction will advance approximately parallel to the optical axis C. On the other hand, lights La (La_k, La_m) that pass the Fresnel prism 23 (for example, the Fresnel prisms 23_k, 23_m) placed more outside in a radial direction relative to the Fresnel prism 23_1 will advance with an inclination toward outside relative to the optical axis C. The inclination tends to become larger as the Fresnel prisms 23 are placed away from the Fresnel prism 23_1 in a radial direction.

Next, as to the focal distance Fb on the TIR prisms 24, in the present invention, a focal distance Fb_n of a TIR prism 24_n placed n pieces or the most outside in a radial direction is made correspondent with the LED-Sheet distance L. The present invention is however not limited to this configuration. In the plurality of TIR prisms 24 placed inside the TIR prism 24_n in a radial direction, a focal distance Fb will be continuously larger as moving inside in a radial direction. This means that the more away from a TIR prism 24_1 toward the 24_n, the smaller the focal distance Fb continuously becomes. This will be discussed in more detail with reference to FIG. 2. TIR prisms 24_1, 24_j, and 24_n are arranged in order. The TIR prism 24_1 is placed the most inside in a radial direction while the TIR prism 24_n is placed the most outside in a radial direction. Focal distances Fb_1, Fb_j, and Fb_n respectively corresponding to the TIR prisms 24_1, 24_j, and 24_n can be determined in the following relation.

$$Fb\_1>Fb\_j>Fb\_n=L$$

By setting the focal distance Fb of each of the TIR prisms 24, light Lb_n that passes through the TIR prism 24_n placed the most outside in a radial direction will advance approximately parallel to the optical axis C. On the other hand, lights Lb (Lb_1, La_j) that pass the TIR prisms 24 (for example, the TIR prisms 24_1, 24_j) placed more inside in a radial direction than the 24_n will advance with an inclination toward inside relative to the optical axis C. The inclination tends to become larger as the TIR prisms 24 move toward the TIR prism 24_1 in a radial direction.

Hereinafter, a specific contour of each of the prisms 22 and a specific method that changes the focal distance F will be discussed with reference to FIGS. 3A and 3B.

Each of the Fresnel prisms 23 is, as shown in FIG. 3A, formed into a triangular contour in section, and composed of: a first Fresnel surface 23a that is placed inside in a radial direction and approximately parallel to the optical axis C; a second Fresnel surface 23b that is placed outside in a radial direction and that has an inclination relative to the optical axis C (directed oppositely relative to the optical axis C); and a part of the facing surface 21a which is orthogonal to the optical axis C. A pitch Pa is constant (50 μm in this embodiment) regardless of prisms (meaning without depending on the distance from the optical axis C). The pitch Pa will be correspondent with the width of each prism in this embodiment. Here, an angle defined by the first Fresnel surface 23a and the facing surface 21a is set to θa1 (hereinafter referred to as the "first Fresnel surface inclined angle"). An angle defined by the first Fresnel surface 23a and a second Fresnel surface 23b is set to θa2 (hereinafter referred to as the "Fresnel apical angle"). An angle defined by the second Fresnel surface 23b and the facing surface 21a is set to θa3 (hereinafter referred to as the "second Fresnel surface inclined angle").

In the case of the Fresnel prisms 23, the light La that has been emitted from the LED 11 is refracted when introduced into the second Fresnel surface 23b. The light La then exits out in a forward direction from the exit surface 21b of the lens sheet 21. Accordingly, in a condition that the inclined angle θa1 of the first Fresnel surface and the pitch Pa are constant, by changing the Fresnel apical angle θa2 and the second Fresnel surface inclined angle θa3, the focal distance Fa of each of the Fresnel prisms 23 can be adjusted.

Figure 3B:
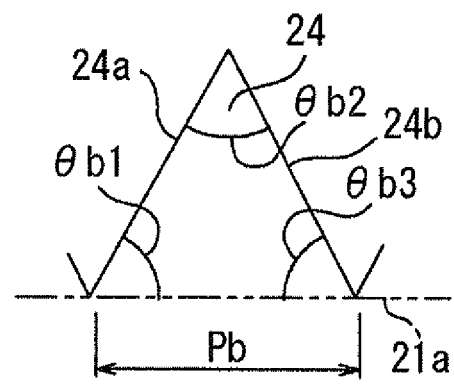

On the other hand, each of the TIR prisms 24 is, as shown in FIG. 3B, formed into a triangular contour in section, and composed of: a first TIR surface 24a that is placed inside in a radial direction and inclined relative to the optical axis C; a second TIR surface 24b that is placed outside in a radial direction and inclined relative to the optical axis C; and a part of the facing surface 21a that is orthogonal to the optical axis C. A pitch Pb is constant regardless of the prisms (50 μm in the present embodiment). Here, an angle defined by the first TIR surface 24a and the facing surface 21a (hereinafter referred to as the "first TIR surface inclined angle") is set to θb1. An angle defined by the first TIR surface 24a and a second TIR surface 24b (hereinafter referred to as the "TIR apical angle") is set to θb2. An angle defined by the second TIR surface 24b and the facing surface 21a (hereinafter referred to as the "second TIR surface inclined angle") is set to θb3.

In the case of the TIR prisms 24, the light Lb emitted form the LED 11 will be introduced into the TIR prisms 24 while being refracted on the first TIR surface 24a. The light Lb is then reflected on the second TIR surface 24b, and exits out in a forward direction from the exit surface 21b of the lens sheet 21. Thus, basically, by changing the TIR apical angle θb2 and the second TIR surface inclined angle θb3, it becomes possible to adjust the focal distance Fb of each of the TIR prisms 24. In the present embodiments, in consideration of operationability of manufacturing the molding die for the TIR prisms 24, the TIR apical angle θb2 (corresponding to the top edge angle of a cutting tool) is set to be constant. That is, the value of the first TIR surface inclined angle θb1 is changed according to the value of the second TIR surface inclined angle θb1.

Next, operational effects of the illuminator 10 structured as above will be discussed hereinbelow.

As a light source, the illuminator 10 uses the LED 11, the LED 11 being able to emit white lights by the following parts in combination: the LED chip 14 emitting blue lights; and the phosphor 16 that receives the blue lights so as to emit (or convert into) yellow lights. Further, the lens sheet 21 is arranged facing the LED 11 with the LED-Sheet distance L. The lens sheet 21 has the plurality of Fresnel prisms 23 at the region A placed at center of the lens sheet 21, and has the plurality of TIR prisms 24 at the regions B placed radially outside the region A. With this structure, as the same with the conventional art, white lights emitted from the LED 11 are allowed to exit out from the whole area of the exit surface 21b of the lens sheet 21 in an effective manner. As a result, the illuminator 10 with a high illuminance can be realized.

As to the Fresnel prisms 23, the focal distance Fa_1 of the Fresnel prism 23_1 placed the most inside in a radial direction is made correspondent to the LED-Sheet distance L. Further, the Fresnel prisms 23 are formed as that the more away from the optical axis C, the longer the focal distance Fa continuously becomes than the LED-Sheet distance L. On the other hand, in the TIR prisms 24, the focal distance Fb_n of the TIR prism 24_n that is placed the most outside in a radial direction is made correspondent to the LED-Sheet distance L. The TIR prisms 24 are then formed as that the more coming toward the optical axis C, the longer the focal distance Fb continuously becomes than the LED-Sheet distance L.

With this structure, lights emitted in a forward direction from the most inside portion of the lens sheet 21 (that is, the Fresnel prism 23_1 and its surrounding) and the most outside portion of the lens sheet 21 (the TIR prism 24_n and its surrounding) will advance approximately parallel to the optical axis C. Here, lights introduced into the region A of the Fresnel prisms 23 (except an area placed at the most inside in a radial direction) will advance with an inclination to outside in a radial direction at variable angles relative to the optical axis C depending on a position (that is, each distance from the optical axis C) into which lights are introduced. Here, the region A except the area placed at the most inside in a radial direction as discussed above will be referred to as the "inner peripheral side area" when appropriate. On the other hand, lights introduced into the region B of the TIR prisms 24 (except an area placed at the most outside in a radial direction) will advance with an inclination to inside in a radial direction at variable angles relative to the optical axis C depending on a position into which lights are introduced. Here, the region B except the area placed at the most outside in a radial direction as discussed above will be referred to as the "outer peripheral side area" when appropriate. That is, when observing all of the lights emitted from the lens sheet 21, the lights emitted from the inner peripheral side area and the lights emitted from the outer peripheral side area will advance forward while being mixed to each other.

As discussed hereinbefore, among lights radially emitted from the LED 11 toward the lens sheet 21, lights emitted approximately parallel to the optical axis C will be bluish white lights while lights emitted with an inclination relative to the optical axis C will be yellowish white light. As said, among lights emitted from the lens sheet 21, lights emitted from the inner peripheral side area and the outer peripheral side area are adapted to advance while being mixed to each other. Accordingly, by mixing the bluish white lights mainly introduced into the inner peripheral side area and the yellowish white lights mainly introduced into the outer peripheral side area, color shadings which have been considered as notable problems can be remarkably reduced.

Next, in order to make the illuminator 10 according to the present embodiment further understood, the specific structure of the lens sheet 21 (hereinafter referred to as the "the present items") will be explained with reference to FIGS. 4A to 4C. Here, as a comparison, conventional structures (hereinafter referred to as the "comparison items") are shown in FIGS. 5A to 5C. In both the present items and the comparison items, they have the LED-Sheet distance of 3 mm, and have the diameter of the lens sheet of 20 mm. The diameter of an emitting surface of the LED is 4.3 mm.

In the comparison items, as shown in FIG. 5A, regardless of the Fresnel prisms or the TIR prisms, both prisms have the constant focal distance of 3 mm (identical with the LED-sheet distance). On the contrary, in the present items, as shown in FIG. 4A, considering the focal distance of the Fresnel prisms, its focal distance at the inner peripheral side area is set to approximately 3 mm. However, as moving toward outside in a radial direction, the focal distance is designed to increase in an ascending ratio. Further, in the focal distance of the TIR prisms, it is designed to gradually increase in a constant ratio as moving toward inside in a radial direction. The focal distance of the TIR prisms that are placed at the most inside area (the area with the radius of 2.4 mm which is a boundary to the Fresnel prisms) is 5 mm. In order to realize the focal distance that is continuously changed in a radial direction (or according to the distance from the optical axis) for each region, the angle of each prism is individually set to the values shown in FIG. 4B. Here, the boundary between the Fresnel prisms and the TIR prisms in the comparison items will be a point where its radius is approximately 1.6 mm.

In the present invention, the illuminator 10 is completed by combining the lens sheet and the pseudo-white LED that are structured as discussed hereinabove. Compared with the comparison items, it could reduce color shadings up to the level that can not be actually observed.

Further, as can be understood by comparing FIG. 4C and FIG. 5C, by continuously changing the focal distance of each prism (especially the Fresnel prisms) in a radial direction, it can be said that the condensing efficacy of light is further improved. Considering the Fresnel prisms, the condensing efficacy shown in FIGS. 4C and 5C means the ratio of lights introduced into the second Fresnel surface among lights introduced into each of the Fresnel prisms (meaning the first Fresnel surface and the second Fresnel surface) from the LED. Further, in the case of the TIR prisms, among lights introduced into each of the TIR prisms from the LED, it is the ratio of lights that are introduced into the second TIR surface and that are reflected. That is, it means that the larger the condensing efficacy is, the more effective light intensities it has as luminous lights.

Figure 6A:
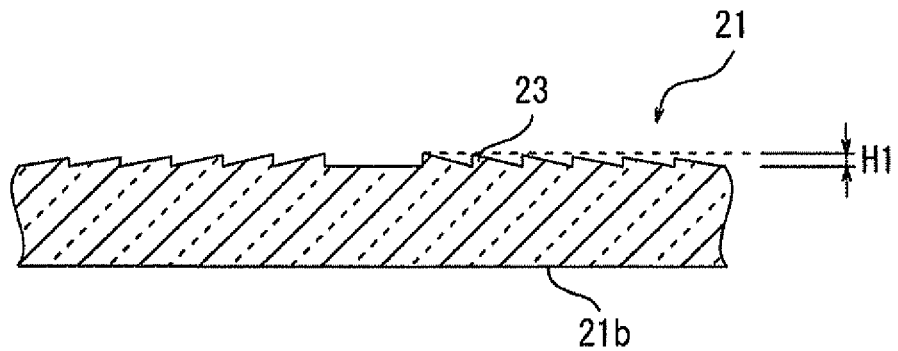
FIG. 6A is a partial sectional view that shows the structure of a plurality of Fresnel prisms of the lens sheet.

In the present invention, the focal distance of each of the Fresnel prisms is made continuously increased in a radial direction. The reason of that the condensing efficacy is improved will be discussed hereinbelow. When comparing FIG. 4B and FIG. 5B, in the comparison items, θa2 of its Fresnel apical angle is made continuously decreased in a radial direction (the inclined angle θa3 is increased). On the other hand, in the present invention, it indicates a specific property as that its Fresnel apical angle θa2 is inflected around 0.7 mm in radius. This specific property reflects the height of each of the Fresnel prisms. In the present items, as shown in FIG. 6A, the height H1 of each Fresnel prism is approximately constant through its radial direction with relatively low values (meaning that the height H1 is flatter than the height H2 of the comparison items as further explained hereinbelow). Specifically, the area of the first Fresnel surface is made approximately constant throughout the radial direction.

Figure 6B:
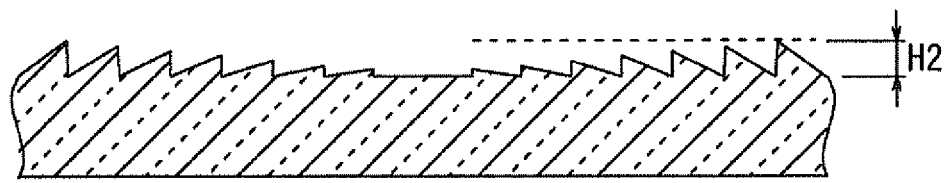
FIG. 6B is a partial sectional view that shows the structure of a plurality of Fresnel prisms on a conventional lens sheet for the purpose of comparison.

On the contrary, in the comparison items as shown in FIG. 6B, the height H2 of the Fresnel prisms becomes increased as moving toward outside in a radial direction (H2>H1). This means that the area of the first Fresnel surface is made increased. Here, since lights that are introduced into the first Fresnel surface will become basically extraneous (meaning not contributing for illuminance), the condensing efficacy of lights accordingly deteriorates at the outer circumference where the area of the first Fresnel surface becomes increased. In the present items compared to the comparison items, it can reduce increase of the area of the first Fresnel surface at the outside thereby contributing to the high efficacy of lights.

Based on the reason discussed hereinabove, by applying the lens sheet 21 according to the embodiments of the present invention, even if pseudo-white LEDs are used as a light source, it can actualize the illuminator with less color shadings and further effective illuminance. Here, through modification of the focal distance of the plurality of prisms 22 in a radial direction, the LED 11 as a light source permits many LED chips 14 to be contained therein while allowing the relatively wide luminous surface 17. Even in this condition, the present inventors have discovered that illumination angles (or, light distribution angles) of lights that have been emitted from the lens sheet 21 can be precisely adjusted.

The preferable embodiments of the present invention have been discussed hereinabove; however, the present invention is not limited thereto. The present invention allows variable modifications as long as they do not deviate from the intent of the present invention.

For example, in the above preferable embodiments, the focal distance F of each of the prisms 22 is continuously changed in a radial direction for each Fresnel prism 23 as well as for each TIR prism 24. The present invention is, however, not limited to this embodiment. In the present invention, for example, it can change the focal distance F of the prisms optionally selected from the plurality of the prisms 22, or randomly vary the focal distance F of all prisms in the plurality of the prisms 22. When structured in this way, the color shadings of lights can be further effectively reduced. Especially, when the LED 11 occupies the relatively wide luminous surface 17 and is applied as a light source, the focal distance F of the TIR prisms 24 placed on the region B (that is, the outer periphery area on the lens sheet 21, see FIG. 1) is randomly changed irrespective of the distance form the optical axis C. Through application of this configuration, the color shadings are further effectively reduced. Note that, even if the focal distance F has been randomly changed in a radial direction, the present inventors have confirmed that the illumination angle will be still controllable to achieve predetermined values.

Further, as to the Fresnel prisms 23 and the TIR prisms 24 of the present invention, the focal distance of each of the prisms 22 is made either increased or decreased in one direction in a radial direction. The present invention is, however, not limited to this embodiment. In the present invention, according to the condition of chromaticity distributions of lights emitted from the LED 11, it would be possible, for example, to have the following area in combination within each region A and region B: 1) a partial area where the focal distance F is increased; 2) a partial area where the focal distance F is decreased; and 3) a partial area where the focal distance F is constant (meaning the partial area where adjacent prisms have the same focal distance).

Still further, in the above preferable embodiments, the focal distance F of both the Fresnel prism 23_1 (the most inside prism in a radial direction) and the TIR prism 24_n (the most outside prism in a radial direction) of the lens sheet 21 are approximately correspondent with the LED-Sheet distance L. The present invention is, however, not limited to this embodiment. It can set the focal distance F of the Fresnel prism 23_1 and the TIR prism 24_n different from the LED-Sheet distance L according to the orientation properties of outgoing lights to be required.

Yet further, In the above embodiment, the plurality of prisms 22 on the lens sheet 21 has been configured to have concentricity (or, to have a rotational symmetry) around the optical axis C. The present invention is however not limited to this configuration. The plurality of prisms 22 formed on the lens sheet 21 may be, for example, a linear prism that is linearly arranged (including a linearly symmetrical arrangement and a linearly asymmetrical arrangement). Even in this configuration, the same or similar operational effects as discussed hereinabove can be expected (see FIG. 2 of the aforementioned Japanese Patent Application Laid-open No. 2002-221605 for the lens sheet with the plurality of linear prisms).

In addition, in the above embodiments, all of the prisms 22 have been formed on the facing surface 21a of the lens sheet 21. The present invention is however not limited to this configuration. Instead, all of the prisms 22 may be formed on the exit surface 21b of the lens sheet 21. Considering a lens sheet 21B in FIG. 8, the Fresnel prisms 23 are formed on the exit surface 21b of the lens sheet 21 while the TIR prisms 24 are formed on the facing surface 21a of the lens sheet 21.

Moreover, in FIG. 8, the Fresnel prisms 23 are configured to be convex Fresnel prisms whose inclined surfaces (that is, the second Fresnel surface 23b) direct in an opposite direction relative to the optical axis C. Here, in this embodiment, a unit of convex Fresnel lens is composed of a plurality of convex Fresnel prisms. The present invention is however not limited to this configuration. Instead, as a lens sheet 21C of FIG. 9, it is possible to apply concave Fresnel prisms whose inclined surfaces (the second Fresnel surface 23b) direct toward the optical axis C. Here, of course, a unit of concave Fresnel lens is composed of a plurality of concave Fresnel prisms as the same. Having the concave Fresnel lens formed on the facing surface 21a of the lens sheet 21, even higher condensing efficacies will become obtainable, contributing to achievement of more desirable operational effects of the present invention. Note that the convex Fresnel lens and the concave Fresnel lens are applicable in combination. In this case, the concave Fresnel lens may be formed at an area near the optical axis. Or, the convex Fresnel lens may instead be formed at the area near the optical axis.

Additionally, the prisms on the facing surface 21a and the prisms on the exit surface 21b are partially or entirely overlappable to each other in a planar view. For example, in a lens sheet 21D of FIG. 10, the concave Fresnel lens formed at the region A of the facing surface 21a and the convex Fresnel lens formed at the region A of the exit surface 21b are overlapped to each other in a planar view. In this case, the region of the exit surface 21b on which the Fresnel prisms are formed does not need to correspond to the region of the facing surface 21a on which the Fresnel prisms are formed as the same. Here, the Fresnel prisms formed on the exit surface 21b may have an area either narrower or wider than the region A. The Fresnel prisms on the exit surface 21b may be arranged, for example, circularly.

Figure 7:
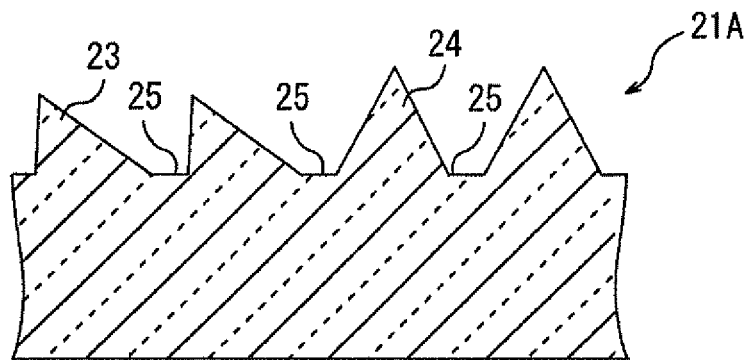
FIG. 7 is a partial sectional view that shows the modified example of the lens sheet.
Figure 11:
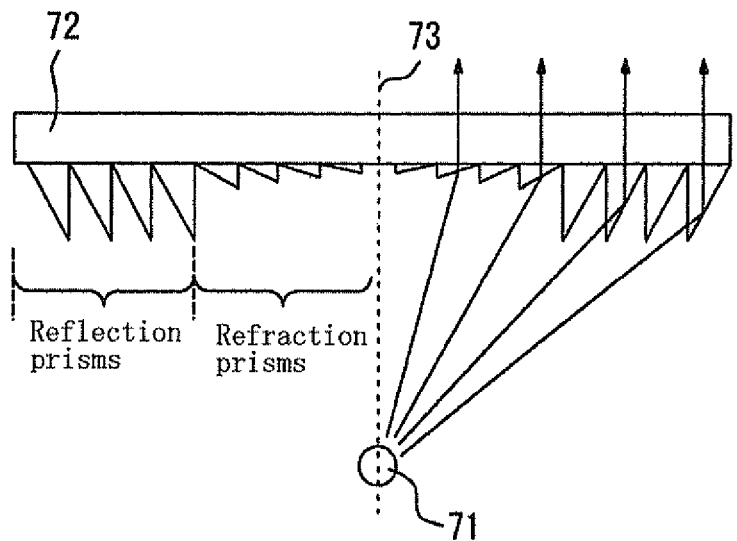
FIG. 11 is a sectional view that explains the structure of a conventional Fresnel lens and outgoing lights (hatching omitted)
Figure 12:
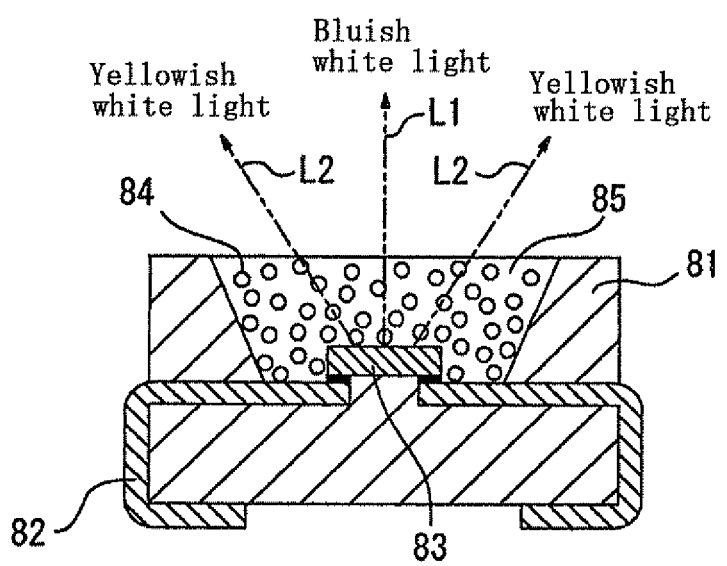
FIG. 12 is a sectional view that explains the structure of a pseudo-white LED and outgoing lights.

Furthermore, in the above preferable embodiments, each of the prisms 23, 24 is arranged to each other with no space therebetween. The present invention is, however, not limited to this embodiment. For example, as a lens sheet 21A shown in FIG. 7, it can have a flat surface 25 between each of the prisms 23 and the prisms 24 adjacent to each other, the flat surface 25 being orthogonal to the optical axis C. Even if the flat surface 25 is formed as above, it can reduce color shadings and increase condensing efficacies thus contributing to facilitation of manufacturing the lens sheet.

Also, in the above preferable embodiments, the pseudo-white LED 11 is applied as a light source. However, the present invention allows that the other types of light sources are combined with the lens sheet. Also in this embodiment, the reduction of color shadings and the improvement of illuminance are expected.

In addition, in the above preferable embodiments, on the lens sheet 21, the Fresnel prisms 23 and the TIR prisms 24 are formed. However, for example, in case that light sources with a relatively high directivity (meaning a small radiation angle) are applied, it is possible that only Fresnel prisms 23 are formed on the lens sheet 21. In this case also, it is possible to have the reduction of color shadings and the improvement of illuminance.

Moreover, in the above preferable embodiments, the phosphors 16 are dispersively formed in the sealing body 15 in order to receive blue lights emitted by the LED chip 14 so as to radiate yellow fluorescent lights. However, the present invention is not limited to this embodiment. The sealing body 15 may not have the phosphors 16 therein. Instead, the phosphors 16 may be directly laminated on the LED chip 14.

Lastly, in the above preferable embodiments, a piece of lens sheet is arranged at per one light source. However, the present invention is not limited to this embodiment. Instead, for example, the following embodiments are of course applicable. That is, a plurality of lens sheets is arrangeable into a plane surface, and the light source may be each arranged at each of the lens sheets (plural illuminators). In the above case, the plurality of lens sheets is allowed to have an integral formation.

What is claimed is:

1. An illuminator comprising:
    a light source; and
    a lens sheet that is arranged on an optical axis of the light source and that has a plurality of prisms,
    wherein the light source is composed of: (i) a luminous element configured to emit lights and (ii) phosphors that irradiate with the lights emitted from the luminous element,
    the plurality of prisms includes at least some prisms that each have a focal distance that is different from that of adjacent prisms of the plurality of prisms,
    the plurality of prisms of the lens sheet includes at least (i) a plurality of refraction prisms with certain refraction functions or (ii) a plurality of reflection prisms with certain reflective functions, and
    at least (i) some light refracted by the plurality of prisms has a different angle than other light refracted by the plurality of prisms or (ii) at least some light reflected by the plurality of prisms has a different angle than other light reflected by the plurality of prisms.

2. The illuminator according to claim 1, wherein the lens sheet includes an area where at least some prisms among the plurality of the prisms are configured to have focal distances that vary according to distance from the optical axis.

3. The illuminator according to claim 2, wherein the plurality of prisms includes at least the plurality of refraction prisms, and
    wherein prisms of the plurality of refraction prisms are configured to have focal distances that become larger when moving away from the optical axis.

4. The illuminator according to claim 3, wherein the plurality of refraction prisms is formed on a surface of the lens sheet that faces the light source.

5. The illuminator according to claim 2, wherein the plurality of prisms includes at least the plurality of reflection prisms, and
    wherein prisms of the plurality of reflection prisms are configured to have focal distances that become larger when moving closer to the optical axis.

6. The illuminator according to claim 1, wherein the lens sheet includes an area where prisms of the plurality of prisms are configured to have focal distances that randomly vary irrespective of distance from the optical axis.

7. The illuminator according to claim 6, wherein the area where the focal distances randomly vary is positioned at an outer periphery of the lens sheet.

8. The illuminator according to claim 1, wherein the plurality of prisms is arranged in a rotational symmetry around the optical axis.

9. The illuminator according to claim 1, further comprising a flat surface disposed between adjacent prisms of the plurality of prisms.

10. The illuminator according to claim 1, wherein the luminous element is a light-emitting diode configured to emit a blue-series light, and the phosphor is configured to receive the blue-series light and to convert the blue-series light into a yellow-series light.

11. The illuminator according to claim 1, wherein the prisms of the plurality of prisms are linearly arranged.

12. The illuminator according to claim 1, wherein the plurality of prisms includes at least (i) the plurality of refraction prisms and (ii) the plurality of reflection prisms.

13. A lens sheet arranged on an optical axis of a light source, the light source being composed of (i) a luminous element configured to emit lights and (ii) phosphors that irradiate with the lights emitted from the luminous element, the lens sheet comprising:

a plurality of prisms that includes at least some prisms that each have a focal distance different from the focal distance of an adjacent prism of the plurality of prisms, wherein the plurality of prisms includes at least (i) a plurality of refraction prisms with certain refraction functions or (ii) a plurality of reflection prisms with certain reflective functions, and at least (i) some light refracted by the plurality of prisms has a different angle than other light refracted by the plurality of prisms or (ii) at least some light reflected by the plurality of prisms has a different angle than other light reflected by the plurality of prisms.

14. The lens sheet according to claim 13, wherein the plurality of prisms includes at least (i) the plurality of refraction prisms and (ii) the plurality of reflection prisms.

* * * * *